(12) United States Patent
Kuenemund

(10) Patent No.: US 11,342,285 B2
(45) Date of Patent: May 24, 2022

(54) SEMICONDUCTOR CHIP STATE DETECTOR

(71) Applicant: Infineon Technologies AG, Neubiberg (DE)

(72) Inventor: Thomas Kuenemund, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 17/002,829

(22) Filed: Aug. 26, 2020

(65) Prior Publication Data
US 2021/0066215 A1 Mar. 4, 2021

(30) Foreign Application Priority Data
Sep. 3, 2019 (DE) .......................... 102019123539.1

(51) Int. Cl.
| | | |
|---|---|---|
| H01L 23/00 | (2006.01) | |
| H01L 23/528 | (2006.01) | |
| H01L 27/092 | (2006.01) | |
| H01L 27/02 | (2006.01) | |

(52) U.S. Cl.
CPC ........ *H01L 23/576* (2013.01); *H01L 23/5286* (2013.01); *H01L 27/0218* (2013.01); *H01L 27/092* (2013.01)

(58) Field of Classification Search
CPC ....... H01L 23/00; H01L 23/528; H01L 27/02; H01L 27/092; H01L 23/576; H01L 23/5286; H01L 27/0218; H01L 27/027; H03K 19/003
See application file for complete search history.

(56) References Cited

U.S. PATENT DOCUMENTS

| | | | | | |
|---|---|---|---|---|---|
| 5,455,528 | A | * | 10/1995 | Partovi | H03K 19/0013 326/119 |
| 5,852,552 | A | * | 12/1998 | Kwon | H02M 3/073 363/60 |
| 7,800,930 | B1 | * | 9/2010 | Deshpande | G11C 15/04 365/49.17 |
| 2002/0002663 | A1 | * | 1/2002 | Inoue | G11C 14/00 711/203 |
| 2002/0021145 | A1 | * | 2/2002 | Deng | H03K 19/0963 326/98 |

(Continued)

OTHER PUBLICATIONS

German search Report issued for the corresponding DE application No. 10 2019 123 539.1, dated May 7, 2020, 9 pages (for informational purpose only).

*Primary Examiner* — Sheng-Bai Zhu
(74) *Attorney, Agent, or Firm* — Viering, Jentschura & Partner mbB

(57) ABSTRACT

A semiconductor chip may have at least one p-channel field effect transistor (FET), at least one n-channel FET, a first and a second power supply terminal, wherein the at least one n-channel FET, if supplied with the upper supply potential at its gate, supplies the lower supply potential to the gate of the at least one p-channel FET and the at least one p-channel FET, if supplied with the lower supply potential at its gate, supplies the upper supply potential to the gate of the at least one n-channel FET, a precharge circuit to precharge the circuit to a first state, and a detection circuit configured to output an alarm signal if the circuit enters a second state.

19 Claims, 12 Drawing Sheets

(56) References Cited

U.S. PATENT DOCUMENTS

| | | | |
|---|---|---|---|
| 2009/0236500 A1* | 9/2009 | Shah | H04N 5/378 250/214 C |
| 2010/0213525 A1* | 8/2010 | Masuoka | H01L 21/823828 257/306 |
| 2015/0294944 A1 | 10/2015 | Kuenemund et al. | |
| 2015/0311202 A1* | 10/2015 | Kuenemund | H01L 27/092 257/369 |

* cited by examiner

FIG 2
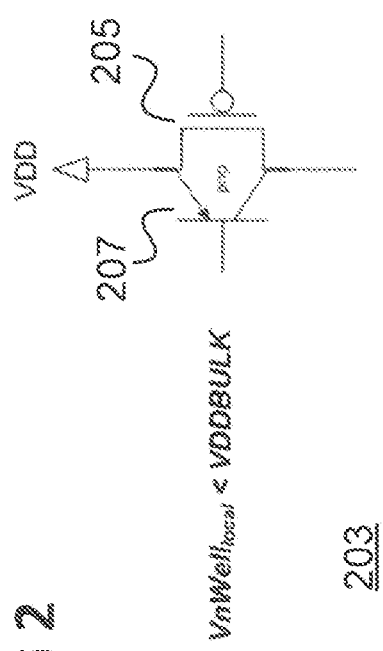
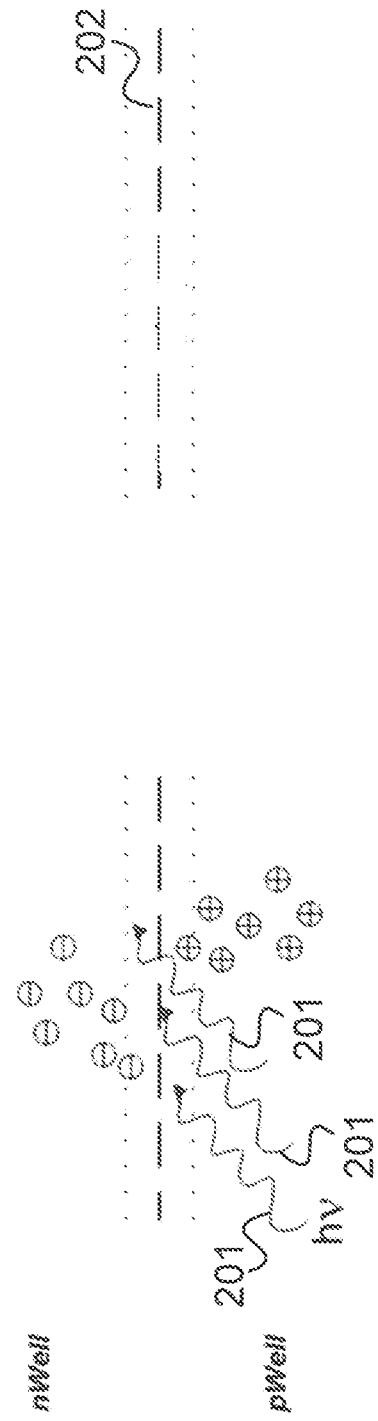
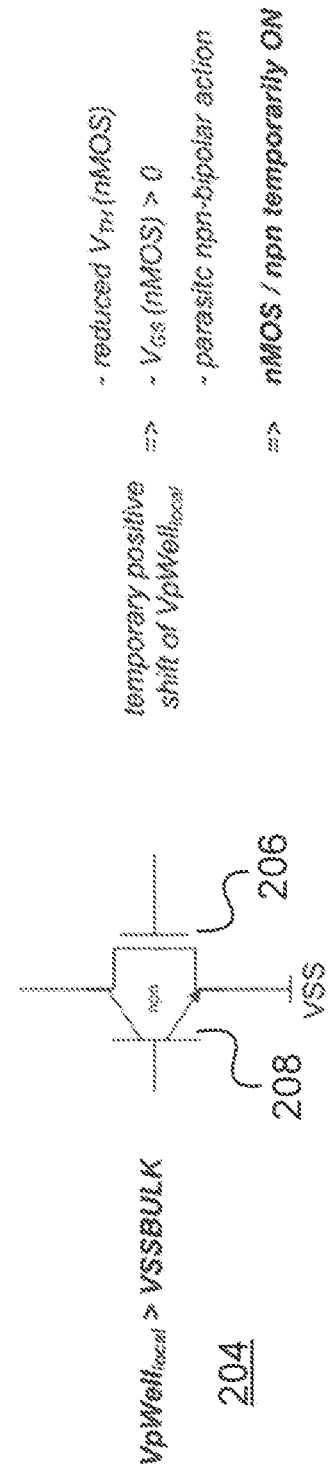

SEMICONDUCTOR CHIP STATE DETECTOR

CROSS-REFERENCE TO RELATED APPLICATIONS

This application claims priority to German Application 10 2019 123 539.1, which was filed on Sep. 3, 2019, the contents of which are fully incorporated herein by reference.

TECHNICAL FIELD

The present disclosure relates to semiconductor chips.

BACKGROUND

Chips having integrated circuits (ICs) which are used for security-critical applications, for example on chip cards or security controllers, are typically intended to be protected against attacks. One type of such attacks is radiation attacks, e.g. laser attacks or ion beam attacks, in the case of which the intention is to bring about a functional disturbance of a component. Possibilities for detecting such fault attacks on digital circuits are desirable.

BRIEF SUMMARY

According to an embodiment, a semiconductor chip is provided including a circuit including at least one p-channel field effect transistor, at least one n-channel field effect transistor a first power supply terminal configured to receive a first supply voltage with an upper supply potential and a second power supply terminal configured to receive a second supply voltage with a lower supply potential, wherein the at least one p-channel field effect transistor and the at least one n-channel field effect transistor are connected such that the at least one n-channel field effect transistor, if supplied with the upper supply potential at its gate, supplies the lower supply potential to the gate of the at least one p-channel field effect transistor and the at least one p-channel field effect transistor, if supplied with the lower supply potential at its gate, supplies the upper supply potential to the gate of the at least one n-channel field effect transistor, a precharge circuit configured to precharge the circuit to a first state in which the potential at the gate of the at least one n-channel field effect transistor is lower than the upper supply potential and the potential at the gate of the at least one p-channel field effect transistor is higher than the lower supply potential and a detection circuit configured to detect whether the circuit has entered a second state in which the potential at the gate of the at least one n-channel field effect transistor is the upper supply potential and the potential at the gate of the at least one p-channel field effect transistor is the lower supply potential and configured to output an alarm signal if it has detected that the circuit has entered the second state.

BRIEF SUMMARY OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which:

FIG. 2 illustrates physical effects in CMOS (Complementary Metal Oxide Semiconductor) technology in case of a laser fault attack.

DETAILED DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
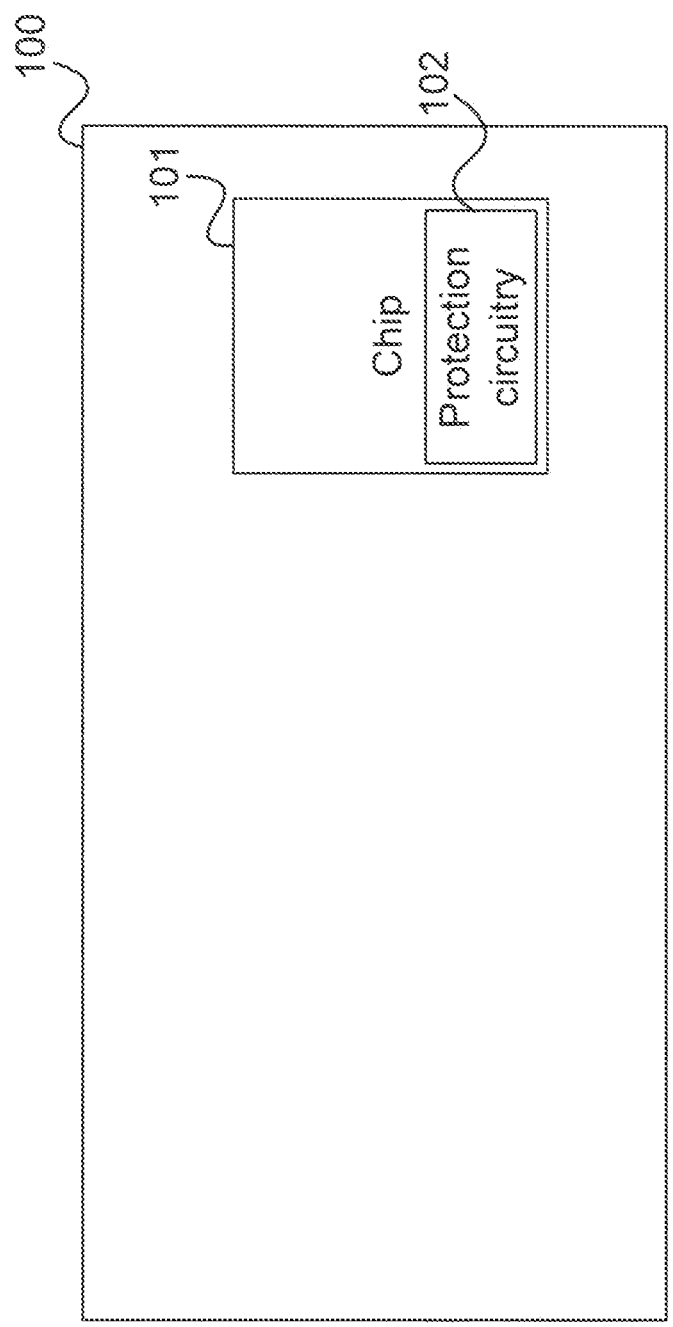
FIG. 1 shows one example of a data processing device which is intended to be protected against radiation attacks.

FIG. 1 shows one example of a data processing device 100, which is intended to be protected against radiation attacks.

The data processing device 100 can be a control unit or a microcontroller in a vehicle, e.g. an ECU (Electronic Control Unit) in an automobile. It can also be a chip card IC (Integrated Circuit) of a chip card such as a smart card having an arbitrary form factor, e.g. for a passport or for a SIM (Subscriber Identity Module).

The data processing device 100 includes an integrated circuit, e.g. a (semiconductor) chip 101, which is intended to be protected against radiation attacks. The chip can be a control chip and implement for example a processor, a coprocessor (e.g. a crypto-processor) and/or a memory. The chip can also for example be an RFID (Radio-Frequency Identification) chip or implement a SIM (Subscriber Identity Module) for a cellular phone. The chip can be provided for a security application and e.g. store or process secret data and/or be configured for authenticating a user. For protection of the chip 101, it includes attack detection circuitry (e.g. fault attack protection circuitry) 102. It should be noted that the attack detection circuitry 102 may include a multiplicity of circuits distributed over the chip to protect several (possibly all) areas of the chip 101.

By way of example, light sensors can be integrated on an integrated circuit (IC1) 101 for a security application, said light sensors being embodied as analog circuits and being designed to protect the entire IC or at least very large regions thereof against global (i.e. large-area) light attacks (or generally radiation attacks). However, such light sensors are typically not suitable for protecting individual, relatively small circuit blocks against local attacks (on areas of from one to a few hundred standard gate areas, e.g. featuring areas of 1 μm² up to some 100 μm²) since they do not provide enough sensitivity for proper protection for local attacks.

Moreover, the functional principles of such analog circuits are based on different physical effects than those typically utilized for fault attacks on single pieces of digital circuitry, e.g. CMOS (Complementary Metal Oxide Semiconductor) gates, in order to achieve the desired malfunction. That is why local fault attacks cannot be detected reliably enough (i.e. not with sufficient probability) by analog light sensors.

According to various embodiments, the attack detection circuitry 102 implements a fault detection approach referred to as Non-Equilibrium Circuitry for Fault Attack Detection (NEC-FAD). It basic concept can be seen to rest, for one part, upon physical effects associated with any CMOS technology and illustrated in FIG. 2.

FIG. 2 illustrates physical effects in CMOS technology in case of a laser fault attack.

Photocurrent pulses 201 (represented by the photon energy hv) lead to (laser-induced) electron-hole pair formation and charge separation at the pn junction 202 (space charge zone) between n-type well 203 and p-type well 204.

The n-/p-type well-restricted majority charge carriers have comparatively long lifetimes. The pair formation and charge separation lead to a shift in the local well potentials and consequently to a combination of charge injection into reverse biased drain junctions MOSFET (Metal Oxide Semiconductor Field Effect Transistor), threshold voltage reduction of the respective MOSFETs 205, 206 and switching of the respective parasitic bipolar transistors 207, 208, which results in the flipping of a bit (in particular in elements such as latches and flip-flops with feedback loops of a data memory) as desired by an attacker.

According to various embodiments, the physical effects described with reference to FIG. 2 are detected with the (dedicated) attack detection circuitry 102 for fault attack protection, taking advantage of extremely non-linear electro-thermal deep-sub-threshold relaxation processes from non-equilibrium states towards states of constrained equilibrium.

Figure 3:
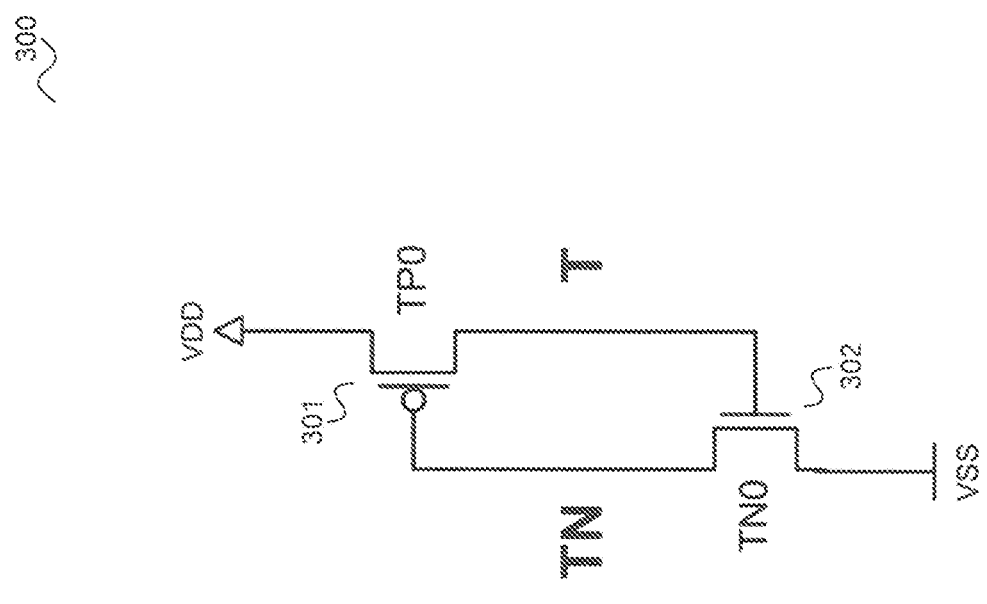
FIG. 3 shows a TIE cell.

Specifically, according to various embodiments, the attack detection circuitry 102 is based on so-called TIE-cells as illustrated in FIG. 3.

FIG. 3 shows a TIE cell 300.

The TIE cell 300 includes a p-channel field effect transistor (FET) 301 whose source is connected to a high supply potential (VDD), whose gate is connected to the drain of an n-channel field effect transistor 302 and whose drain is connected to the gate of the n-channel field effect transistor 302. The source of the n-channel field effect transistor 302 is connected to a low supply potential (VSS). It should be noted that all FETs mentioned herein may for example be MOSFETs (Metal Oxide Semiconductor Field Effect Transistors).

The node (or connection) connecting the gate of the p-channel field effect transistor 301 with the drain of the n-channel field effect transistor 302 is in the following referred to as TN and the node (or connection) connecting the gate of the n-channel field effect transistor 302 with the drain of the p-channel field effect transistor 301 is in the following referred to as T. In the following, for simplicity, the state of a node is also denoted with the name to the node, e.g. T is also referred to the state (or signal) at node T.

For the following explanation, let the attack detection circuitry 102 include a TIE cell 300 (in practical application, the attack detection circuitry 102 may include a very high number of TIE cells 300 distributed over the area of the chip 101).

First, the case without any laser induced photo current injection is considered. This means the case of constrained electro-thermal equilibrium. It is assumed that the supply potential difference VDD−VSS is high enough so that in steady state equilibrium both FETs 301, 302 operate in strong inversion (i.e. they feature fully developed channel inversion):

VDD−VSS>Vth(n-channel FET 302)+|Vth(p-channel FET 301)| where Vth(FET) denotes the threshold voltage of the FET indicated in the parenthesis.

Then, the node voltages' expectation values are the steady state values V(T)=VDD and V(TN)=VSS. That is, even for time variant voltages VDD and VSS, the time-averaged values are the above indicated steady state (and time averaged) values V(T)=VDD and V(TN)=VSS.

Moreover, the circuit's relaxation time ranges from some 100 ps up to the nanosecond regime, depending on process technology, supply voltage and temperature. That is, the potentials V(T) and V(TN) relax from small perturbations (deviations from their steady state values) to their steady state values VDD and VSS with relaxation times in the (sub-)nano-second regime.

For large deviations of V(T) and V(TN) from their equilibrium values, however, there results a completely different behavior of the TIE-Cell circuit components. In particular consider the extreme case of the initial constraint V(T)=VSS and V(TN)=VDD at time t=0.

That is, the node voltages are first kept at the "inverse" values relative to their above equilibrium values so that initially both FETs 301, 302 are OFF, i.e. they are both in their deep-sub-threshold domain.

If then for t>0 the initial constraint is released (i.e. the nodes T and TN are no longer forced to their initial values), the circuitry 300 finds itself initially in a non-equilibrium state, namely in a state as far as possible away from its above described steady state. As a consequence, the potentials of nodes T and TN will, due to inevitable (deep) sub-threshold currents move in the direction of their equilibrium (steady state) values V(T)=VDD and V(TN)=VSS. This transition is, however, an extremely non-linear one that depends heavily on the VDD voltage level relative to VSS, on the temperature T, and in particular on inevitable manufacturing process variations of the circuit components (here FETs 301, 302), so that two instances (copies) of the "same" TIE cell will with very high probability differ in their relaxation times.

Thus, for the application of the TIE cell 300 in attack detection circuitry 101 the geometrical dimensions of the involved transistors 301, 302 are chosen so large that their statistical variations with respect to sub-threshold behavior can be neglected against their VDD and T-dependency. In particular, the TIE cell 300 is dimensioned such that the variations of the sub-threshold currents are small against the mean values, so that e.g. two TIE cells coupled in series relax always slower than one single TIE cell.

A TIE cell 300 may be included in the attack detection circuitry 101 in a circuit referred to as a Controlled TIE Cell (CTC) to make use of the above-described behavior (in particular the relaxation from the "inverse" values) as described above.

Figure 4:
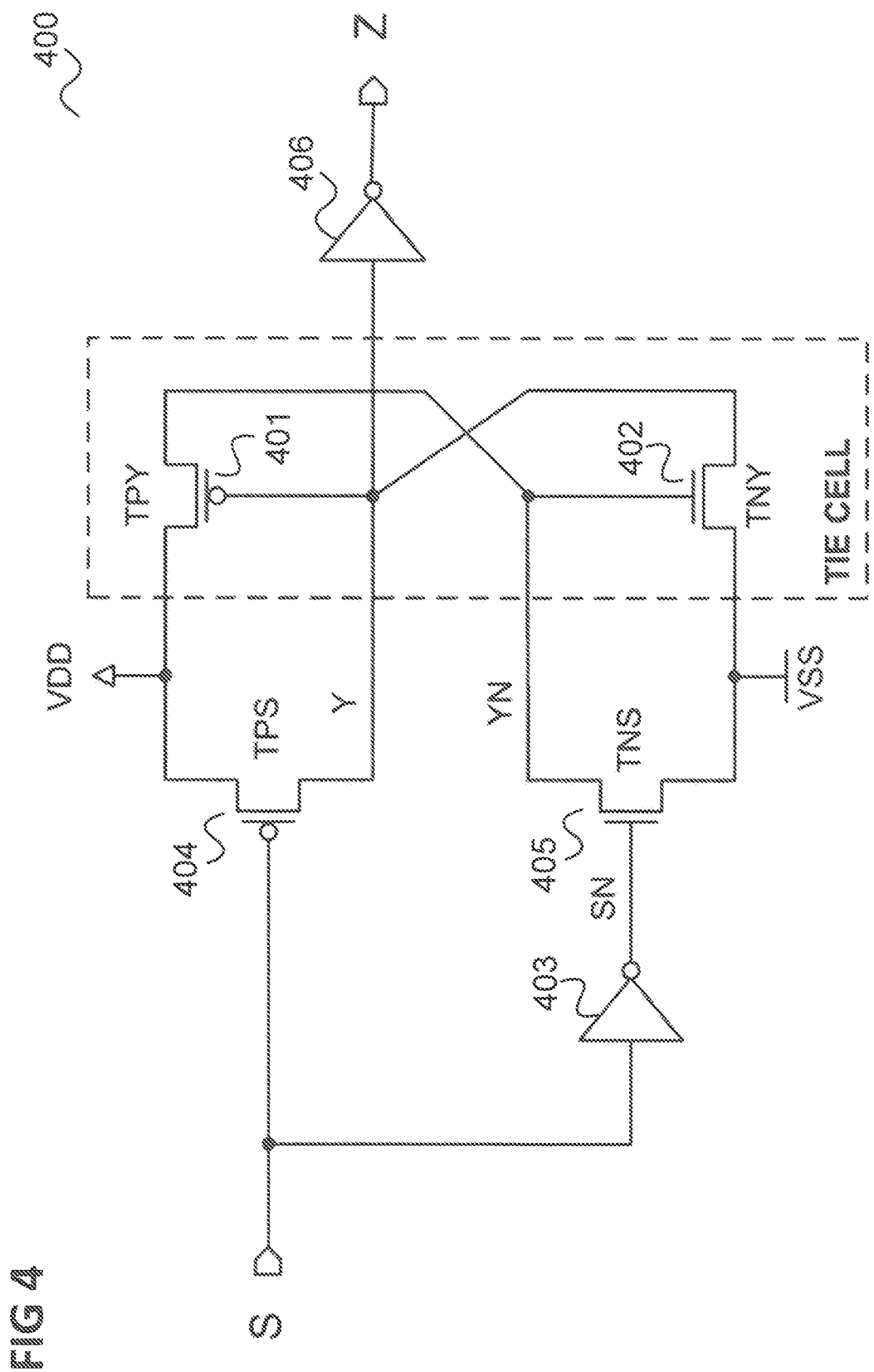
FIG. 4 shows a controlled TIE cell (CTC).

FIG. 4 shows a controlled TIE cell 400.

The controlled TIE cell 400 includes a TIE cell formed by a first p-channel FET 401 and a first n-channel field effect transistor 402. The FETs 401, 402 are cross-coupled and connected to VDD and VSS, respectively, as explained with reference to FIG. 3. However, in addition, the controlled TIE cell 400 includes precharge control circuitry formed by an inverter 403, a second p-channel FET 404 and a second n-channel FET 405.

The gate of the second p-channel FET 404 receives a control input signal S. The inverter 403 receives the control input signal S and inverts it to an inverted control signal SN which it supplies to the gate of the second n-channel FET 405.

The source of the second p-channel FET 404 is connected to the source of the first p-channel FET 401 and its drain is connected to the gate of the first p-channel FET 401.

The source of the second n-channel FET 405 is connected to the source of the first n-channel FET 402 and its drain is connected to the gate of the first n-channel FET 402.

The gate of the first p-channel FET 401 is further connected to an output inverter 406 whose output Z is the output of the controlled TIE cell 400.

Figure 5:
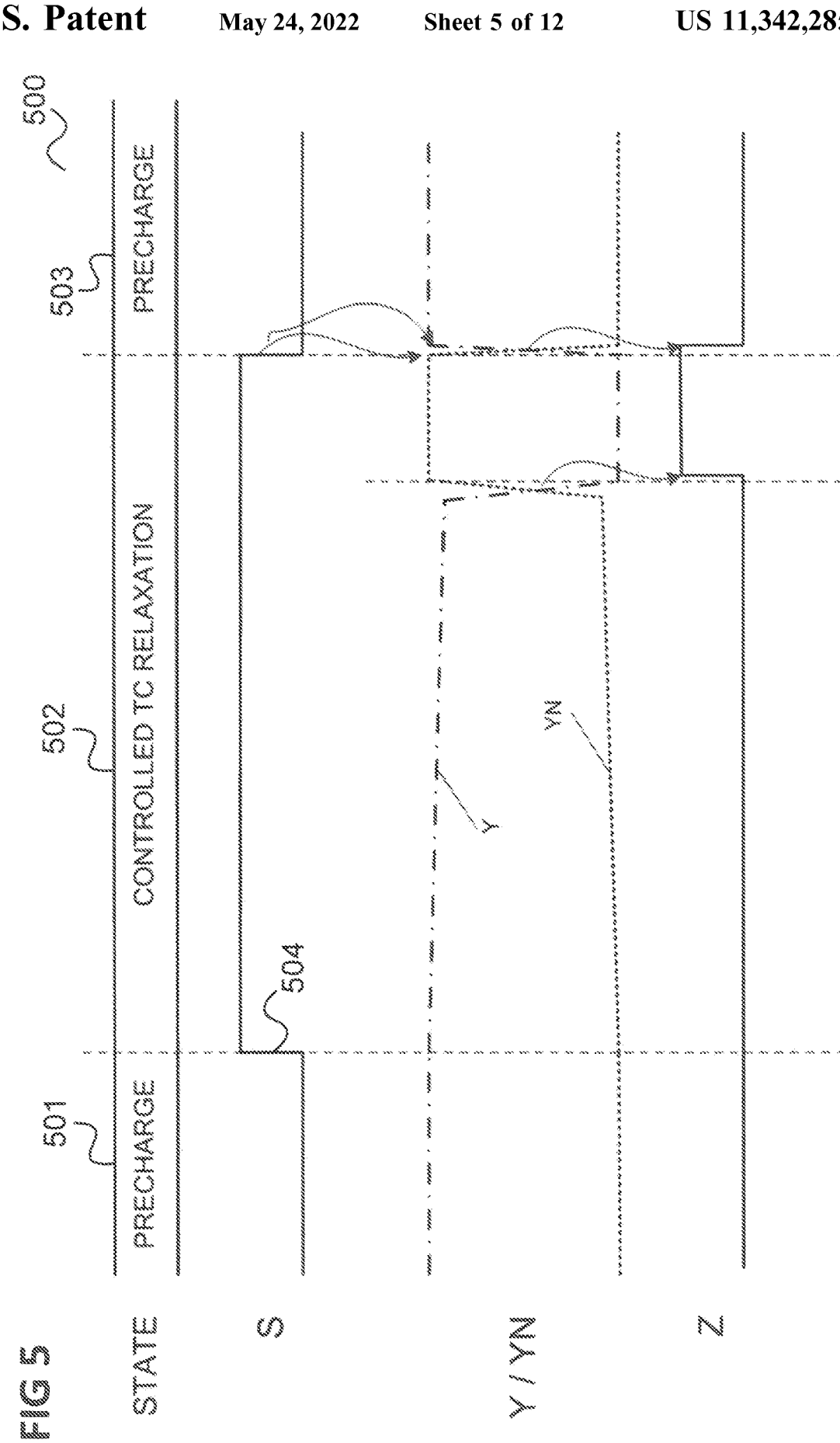
FIG. 5 shows a timing diagram of a precharge and subsequent relaxation for the controlled TIE cell of FIG. 4.

FIG. 5 shows a timing diagram 500 of a precharge and subsequent relaxation (i.e. a precharge and relaxation process sequence) for the controlled TIE cell of FIG. 4.

The signals S, Y, YN, Z are shown over time from left to right (wherein in each case, a line further to the top represents a higher potential (e.g. equal or close to VDD) and a line further to the bottom represents a lower potential (e.g. equal or close to VSS).

First, the precharge control circuitry precharges Y to VDD and YN to VSS for S=0 and SN=1, respectively. This state (Y to VDD and YN to VSS) is referred to as precharge state 501.

After the precharge, with the rising edge 504 of S, i.e. the transition S=0→1, the precharge condition is released and the relaxation 502 from the TIE cell's non-equilibrium state (Y,YN)=(VDD,VSS) towards its steady state (Y,YN)=(VSS, VDD) can take place. Thus, by means of the control input S and its Boolean transitions this can be seen as controlled relaxation from a non-equilibrium state.

This may then be followed by another precharge 503 and so on. This means that the control signal S is periodically switched on and off. For example, the attack detection circuitry includes a clock generator configured to generate the control signal S accordingly.

Figure 6:
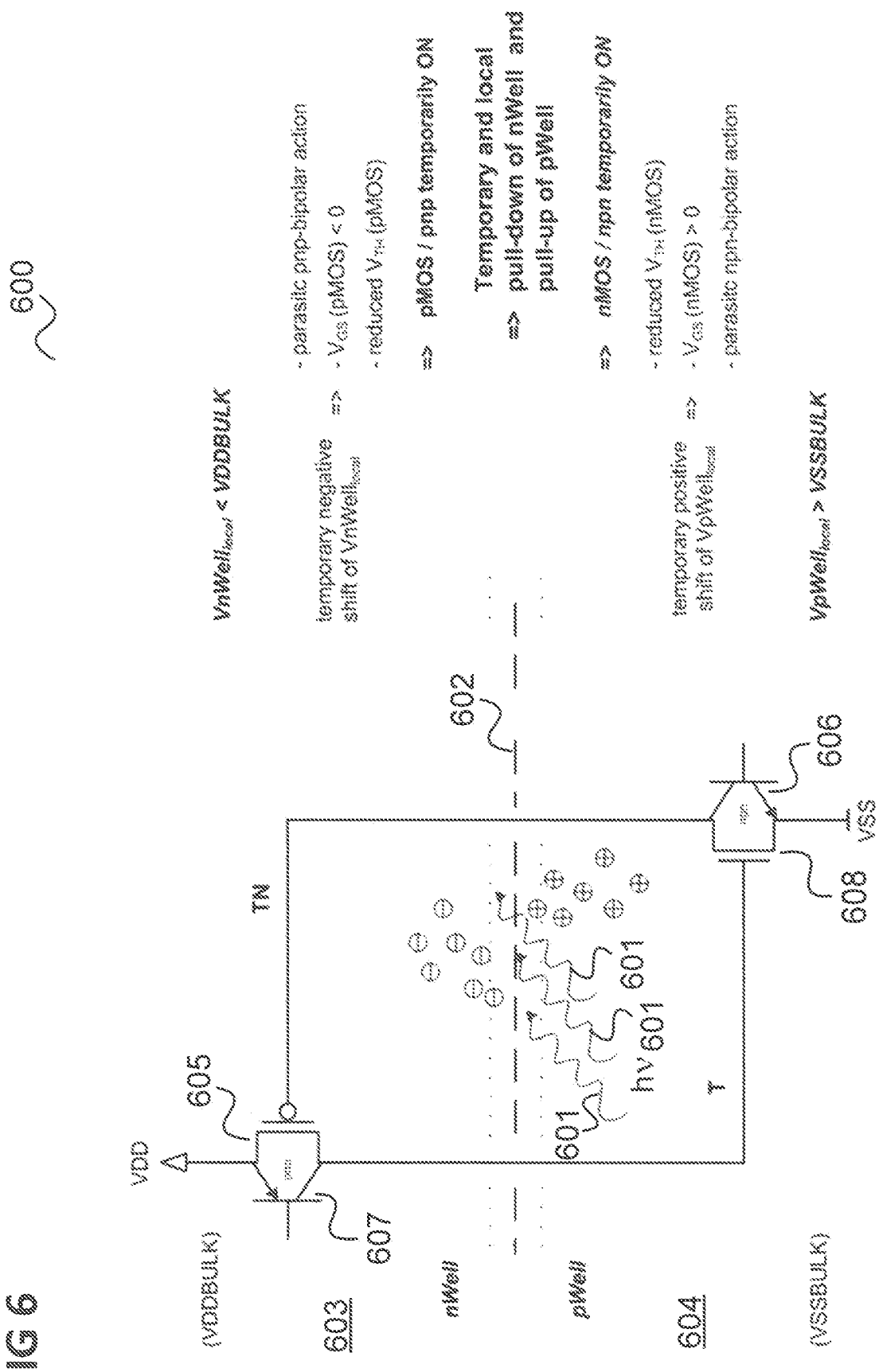
FIG. 6 illustrates the effect of photo current injection due to a fault attack on a TIE cell relaxation process.

FIG. 6 illustrates the effect of photo current injection due to a fault attack on a TIE cell relaxation process.

Similarly to FIG. 2, photocurrent pulses 601 (represented by the photon energy hv) lead to (laser-induced) electron-hole pair formation and charge separation at the pn junction 602 (space charge zone) between n-type well 603 and p-type well 604.

A TIE cell is formed by a p-channel FET 605 and an n-channel FET 606 e.g. corresponding to the FETs 401, 402 of FIG. 4.

As illustrated in FIG. 6, the relaxation of the TIE cell from the non-equilibrium state V(T)=VSS and V(TN)=VDD is accelerated significantly by the laser induced electron-hole pair creation and the charge separation at the nWell-pWell junction 602: the action of the involved pnp bipolar transistor 607 and npn bipolar transistor 608 cooperate and complement each other, resulting in radiation-induced increase of sub-threshold currents of both involved FETs 605, 606.

In addition to that, as long as V(TN)>VSS and V(T)<VDD the drain junctions of both FETs 605, 606 are reverse biased, resulting in charge transfer onto nodes TN and T: negative charge (e−) is collected at node TN and positive charge (h+) at node T so that both nodes move into the direction of electro-thermal equilibrium.

Thus, the relaxation time of the TIE cell from the non-equilibrium state V(T)=VSS and V(TN)=VDD is reduced significantly compared to the relaxation process without laser induced charge separation and its consequences.

According to various embodiments, this effect is exploited by the attack detection circuitry 102 by including instances of two types of controlled TIE cells 400 in the attack detection circuitry 102: a first type referred to as Precharge CTC (P-CTC) and a second type referred to as Detector CTC (D-CTC). The P-CTC may be implemented several times at different positions on the area of the chip 101 to be protected (i.e. the region of interest), whereas a multitude of D-CTC instances are implemented at appropriate distances from each other all over the region of interest. The P-CTC and the D-CTC co-act as described in the following.

Figure 7:
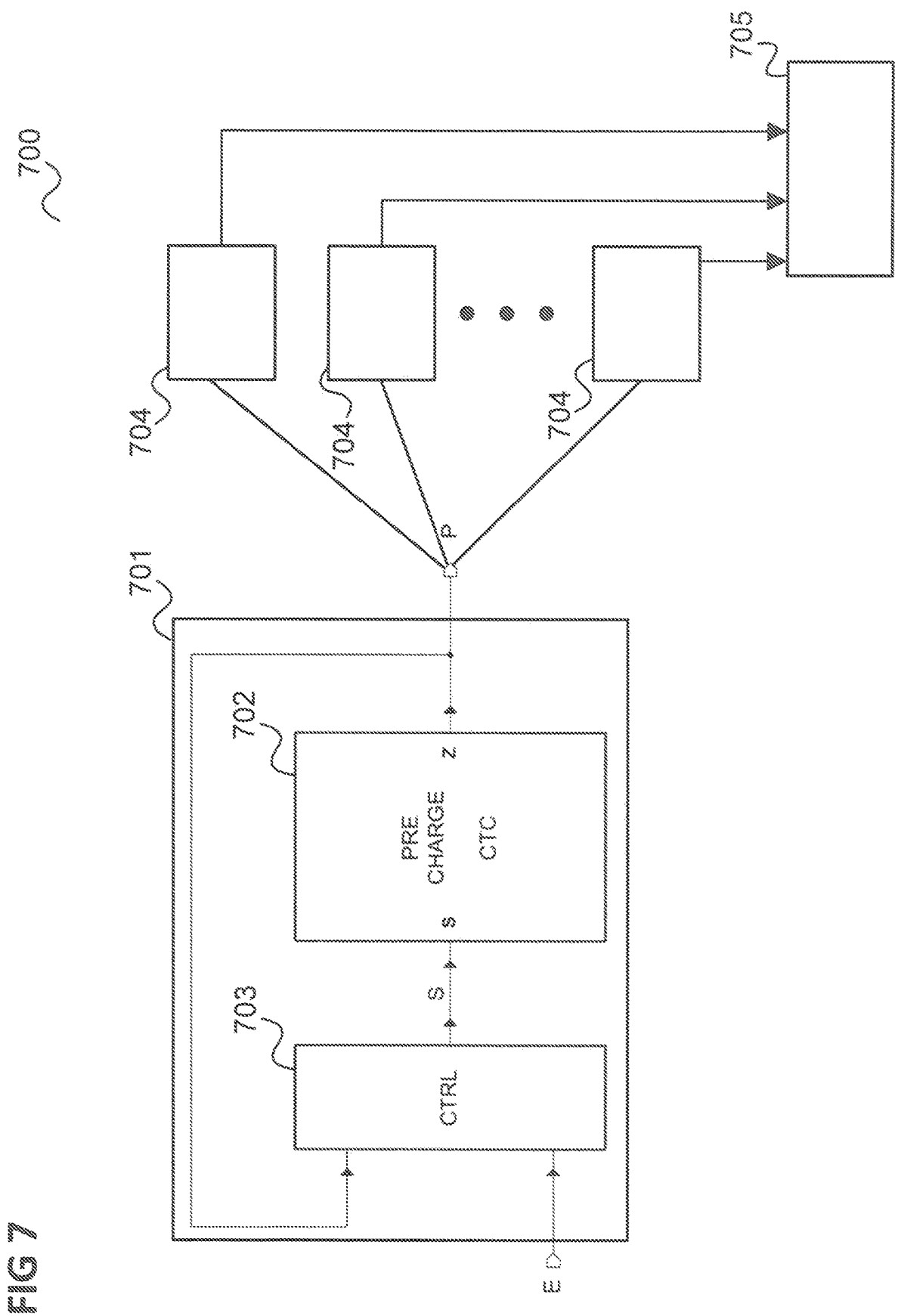
FIG. 7 shows a fault detection arrangement.

FIG. 7 shows a fault detection arrangement 700.

The CTC arrangement includes a P-CTC 701 which includes a controlled TIE cell (CTC) 702 corresponding to the controlled TIE cell 400 of FIG. 4.

The CTCs output Z is the output P of the P-CTC 701. Further, the CTC output Z is fed back by means of feedback circuitry 703 which also receives an enable signal E and generates the control signal S which it supplies to the CTC 702.

As mentioned above, multiple instances of the P-CTC 701 may be included in the attack detection circuit 102.

Each P-CTC instance is assumed to start in its precharge state by means of S=0 resulting in Z=0.

The feedback circuitry 703 is configured to then release the P-CTC 701 from its precharge state by the transition S=0→1, whereupon the above described relaxation takes place, during which the CTC's output Z still remains at 0 until at the end of the relaxation process Y switches to VSS, i.e. to the Boolean 0 so that Z switches to Boolean 1. Then, by means of the feedback circuitry 703 configured accordingly, S is reset to 0 thereby activating another precharge operation. As soon as the precharge is completed, Z is also reset to 0 shortly afterwards, whereupon S is set to 1 again and the next TIE cell relaxation is initiated. Then, the same cycle of events happens again.

The feedback circuitry 703 may for example be realized by the Boolean function S=AND(E, NOT(P)), so that S=0 for E=0 and S=NOT(P) for E=1.

The P-CTC's output P indicating the activation of the precharge state (for P=1 the P-CTC is switched to its precharge state) is not only fed back to P-CTC as described above, but is also the control input for the multitude of D-CTCs 704 of the CTC arrangement 700, so that not only the P-CTC 701 is precharged for P=1 but also all connected D-CTCs 704.

The D-CTCs 704 are dimensioned in a way such that they have much longer relaxation times than the P-CTC 701, so that they are always precharged long before they can relax to their steady states, if there is no photo current injection due to a fault attack.

In case of a fault attack, however, the D-CTC's relaxation times are reduced significantly so that their relaxation to steady state is completed even before the P-CTC 701 can send the precharge pulse P=1. Thus, the D-CTC's output Z can be used as an alarm output by an alarm handling circuit 705 of the fault detection arrangement: Z=1 indicates that a fault attack has been detected. For example, the alarm handling circuit 705 may trigger alarm handling (such as shutdown of components of the chip 101) in case the output of any D-CTC 704 turns to Z=1.

A multiplicity of fault detection arrangements 700 may be included in the attack detection circuitry 102. However, for example, the alarm handling circuit 705 may be shared among multiple fault detection arrangements 700. For example, it may be a central entity of the attack detection circuitry 102.

The much longer "unperturbed" relaxation times of the D-CTCs 704 as compared with the P-CTC 701 may be achieved by different possible measures:

P-CTC and D-CTC have the same transistor structures (e.g. the ones of FIG. 4), but they are implemented with different threshold voltages: if the TIE cell elements 401, 402 of the P-CTC have a lower threshold voltage than those of D-CTC, the D-CTC relaxation times will be much longer than that of a P-CTC.

P-CTC and D-CTC feature the same transistor structures (e.g. the ones of FIG. 4), but they are implemented with different channel lengths and/or widths so that the D-CTC relaxation times are be much longer than that of a P-CTC.

P-CTC and D-CTC feature different transistor structures, e.g. P-CTC like the one of FIG. 4 and D-CTC like that of FIG. 8 described below, i.e. with TIE cells composed of two (or more than two) FETs in series, resulting in much longer relaxation times.

P-CTC and D-CTC feature different transistor structures, e.g. P-CTC like the one of FIG. 4 and D-CTC like that of FIG. 9 described below, i.e. with two (or more than two) serially connected TIE cells, resulting in much longer (approx. double) relaxation times: the second TC can only begin its relaxation phase after the first has finished its relaxation.

Figure 8:
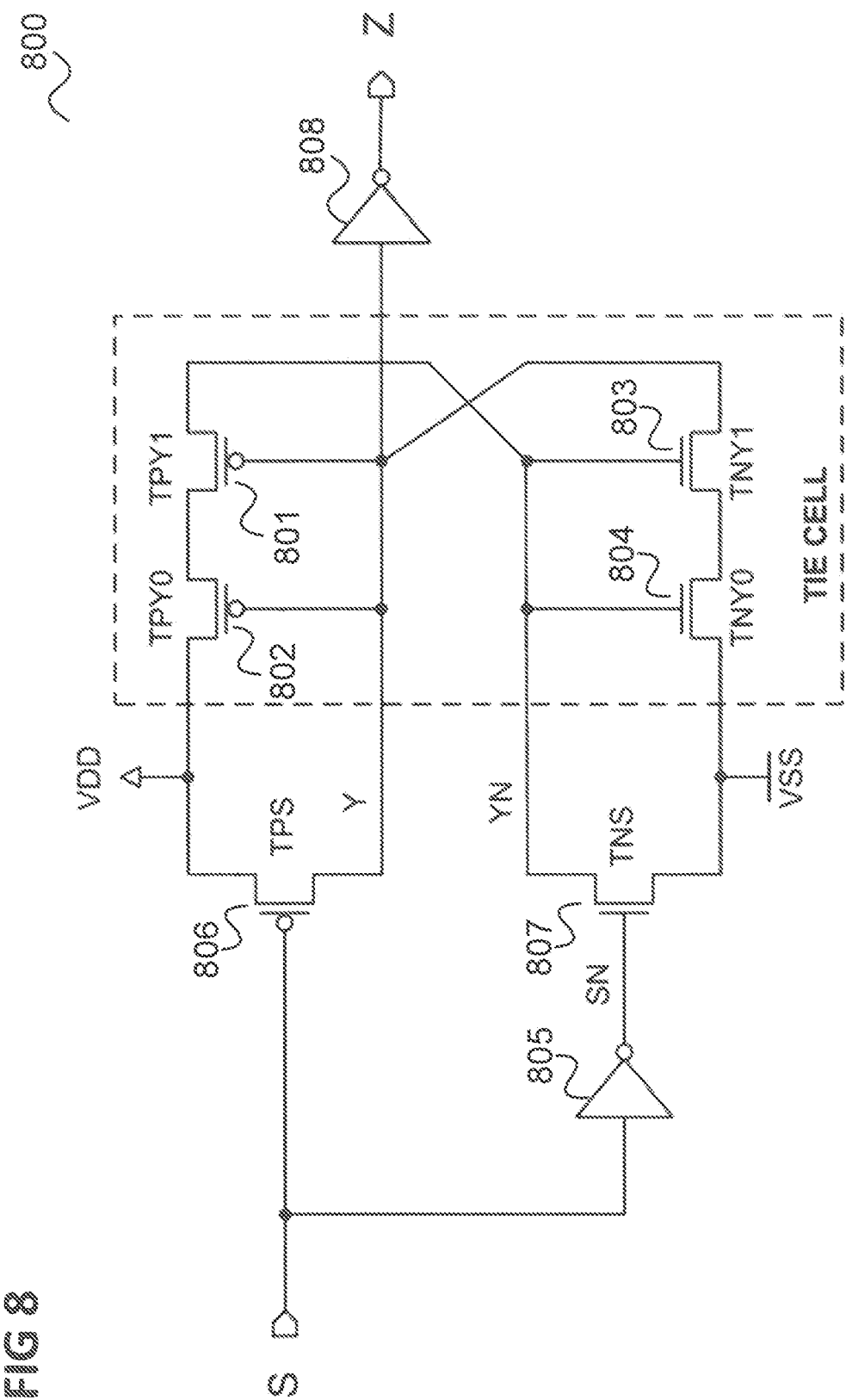
FIG. 8 shows a controlled TIE cell according to a variant.

FIG. 8 shows a controlled TIE cell 800 according to a variant.

The controlled TIE cell 800 includes a TIE cell formed by a first p-channel FET 801, a second p-channel FET 802, a first n-channel FET 803 and a second n-channel FET 804.

The p-channel FETs 801, 802 are cross-coupled with the n-channel FETs 803, 804 and connected to VDD and VSS, respectively, as explained with reference to FIG. 3 but with two p-channel FETs 801, 802 connected in series instead of one and two n-channel FETs 803, 804 connected in series instead of one.

Further, similarly to FIG. 4, the controlled TIE cell 800 includes precharge control circuitry formed by an inverter 805, a third p-channel FET 806 and a fourth n-channel FET 807.

Further, similarly to FIG. 4, the gate of the first p-channel FET 801 is further connected to an output inverter 808 whose output Z is the output of the controlled TIE cell 800.

Figure 9:
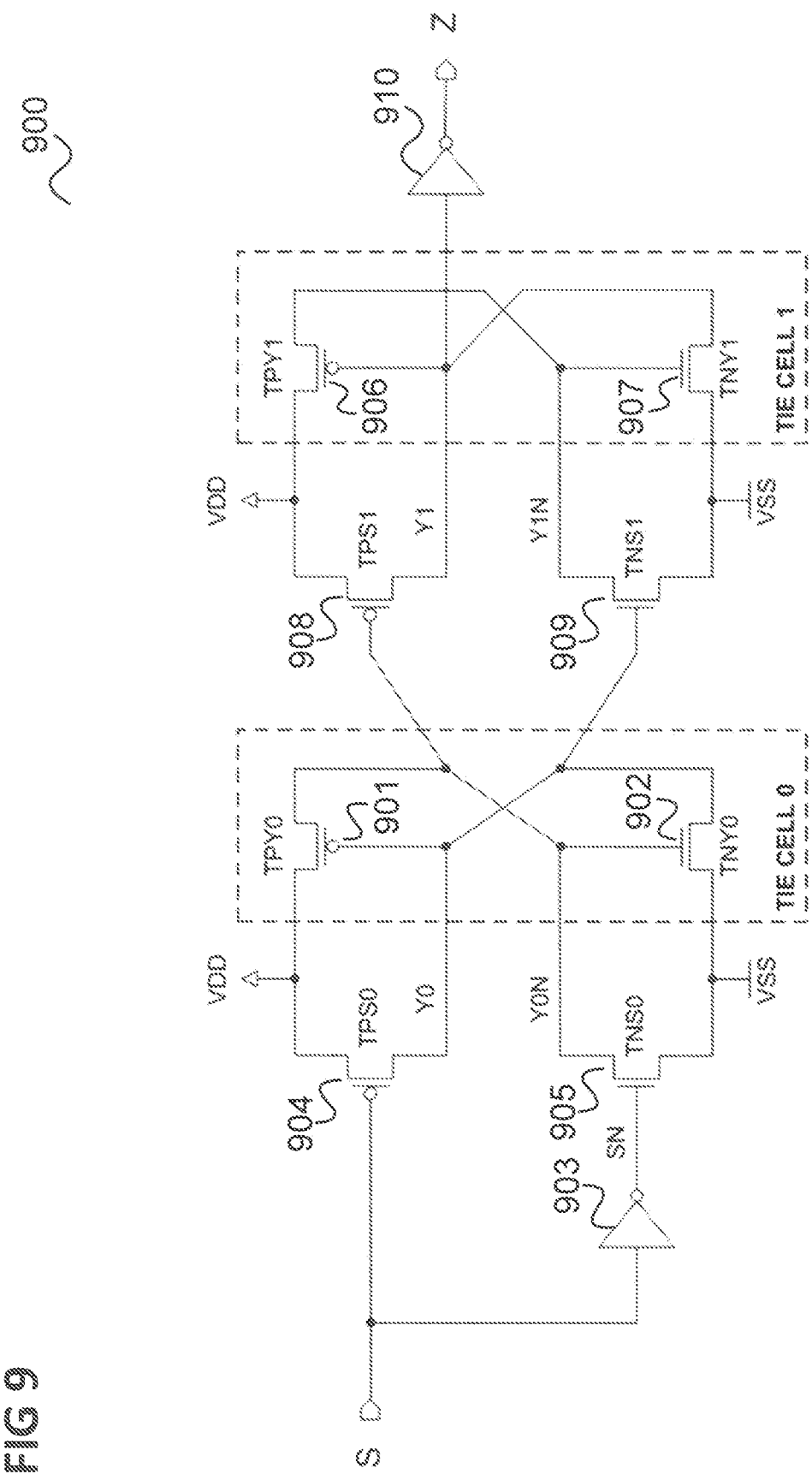
FIG. 9 shows a controlled TIE cell according to a further variant.

FIG. 9 shows a controlled TIE cell 900 according to a further variant.

The controlled TIE cell 900 includes a first part formed of a controlled TIE cell as described with reference to FIG. 4 (without output inverter) formed of a first p-channel FET 901, a first n-channel FET 902, an input inverter 903, a second p-channel FET 904 and a second n-channel FET 905.

This first part is followed by a second part formed of a controlled TIE cell as described with reference to FIG. 4 (without input inverter) formed of a fifth p-channel FET 906, a fifth n-channel FET 907, a sixth p-channel FET 908, a sixth n-channel FET 909 and an output inverter 910 which outputs the output of the controlled TIE cell 900.

The two parts (i.e. the two controlled TIE cell subcircuits forming the controlled TIE cell 900) are connected in a way that the gate of the sixth p-channel FET 908 is connected to the drain of the first p-channel FET 901 and the gate of the sixth n-channel FET 909 is connected to the drain of the first n-channel FET 902.

The scheme of co-acting P-CTC and D-CTC described with reference to FIG. 7 may be further expanded or upgraded, e.g. in a way that more than one of several P-CTC in parallel need to have completed relaxation before the next precharge can be activated, corresponding to a NAND connection of multiple P-CTC outputs, so that simultaneous fault attacks on a subset of the relevant P-CTC and on areas protected by D-CTCs are not sufficient to generate an artificial precharge in order to suppress alarms coming from the D-CTC. This is illustrated in FIG. 10.

Figure 10:
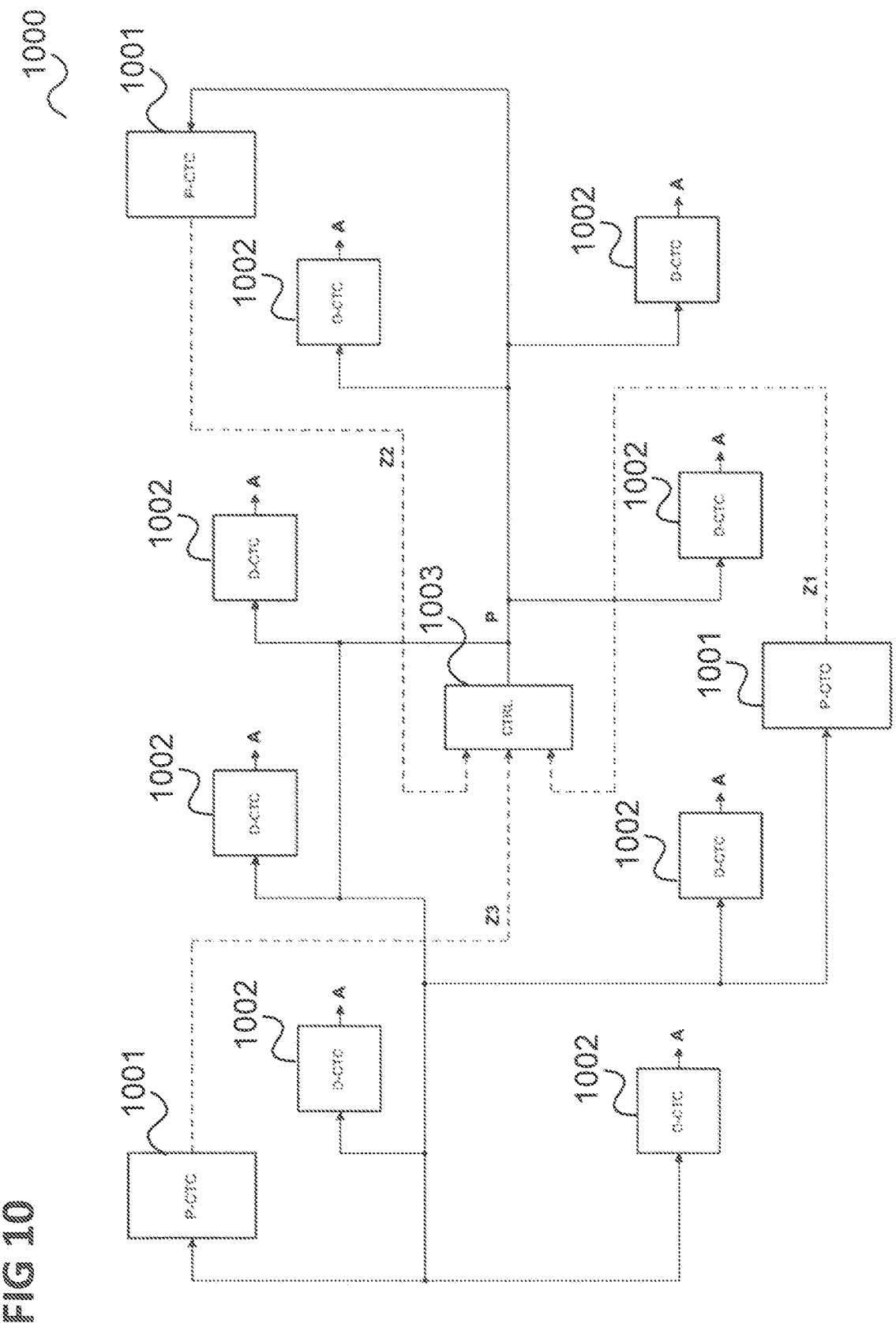
FIG. 10 shows a CTC arrangement according to an embodiment.

FIG. 10 shows a CTC arrangement 1000 according to an embodiment.

The CTC arrangement 1000 includes three P-CTC instances 1001, multiple D-CTC instances 1002 and a control circuit 1003 implementing a Boolean function.

The outputs Z3, Z2 and Z1 of the three P-CTC instances 1001 are combined by the Boolean function to generate the precharge signal P for the P-CTC instances and the multitude of D-CTC instances 1002 (eight of which are shown).

The control circuit 1003 may for instance implement a Boolean NAND or operate according to an inverting MAJORITY gate:

$$P=\text{NOT}(Z3*Z2+Z2*Z1+Z1*Z3).$$

The alarm outputs A of the D-CTC instances 1002 are also shown. They may be supplied to an alarm handling circuit as described with reference to FIG. 7.

Another option for expanding or upgrading the scheme of co-acting P-CTC and D-CTC described with reference to FIG. 7 is to provide more than one CTC assembly including several P-CTCs and a multitude of D-CTCs co-acting as described above. These different CTC-assemblies may in particular be interwoven in a way so that each of the P-CTC instances of a given CTC-assembly is protected by a D-CTC instance of a different CTC-assembly. Again, simultaneous fault attacks on P-CTC and D-CTC areas can then be prevented.

An additional option is to combine the approaches described herein with an approach for fault attack detection which is based on a mutual feedback between to FETs.

Figure 11:
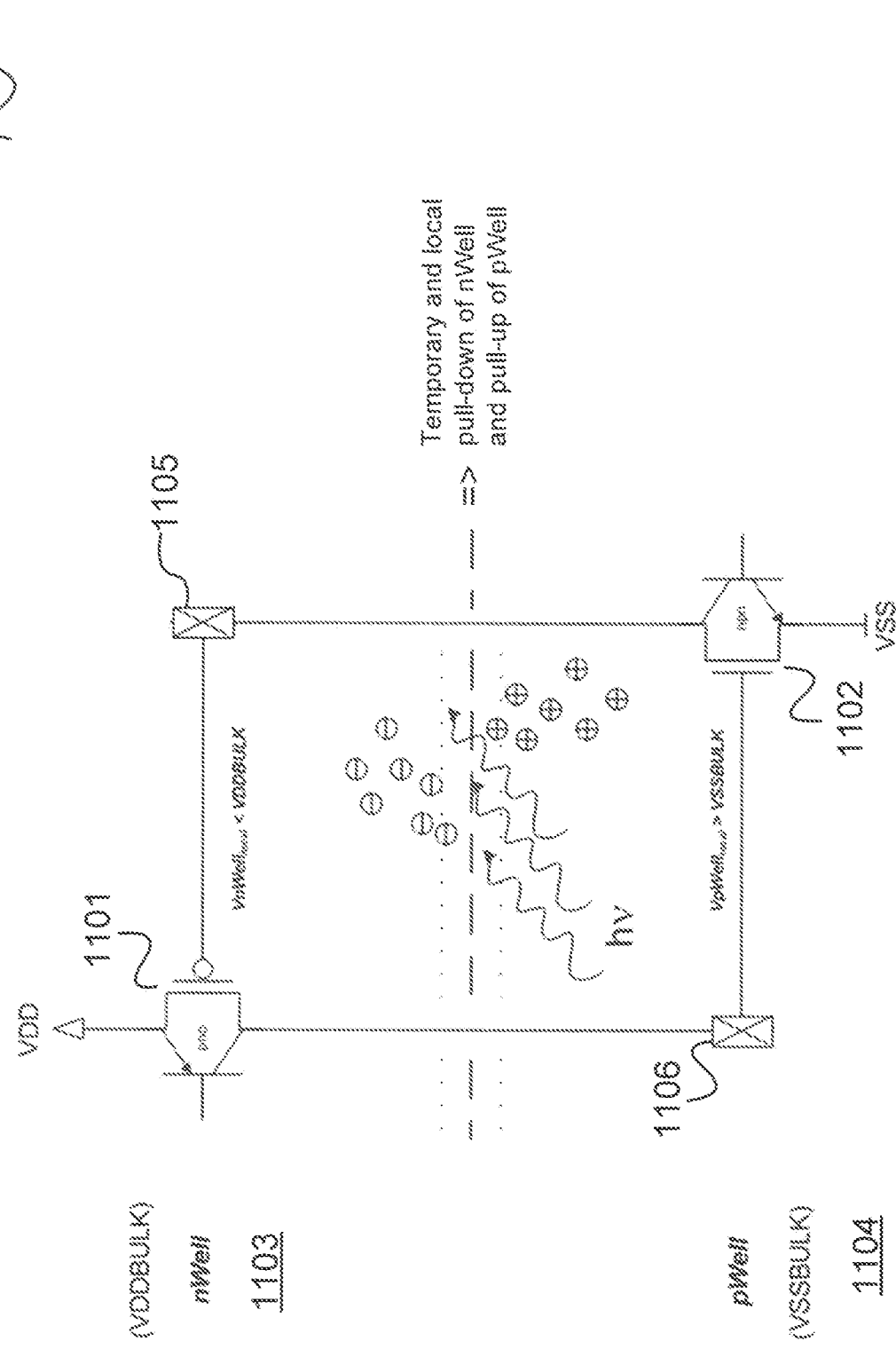
FIG. 11 shows circuitry for fault attack detection which is based on a mutual feedback of a p-channel field effect transistor (FET) in an n-type well and an n-channel FET in a p-type well 1104.

FIG. 11 shows circuitry 1100 for fault attack detection which is based on a mutual feedback of a p-channel FET 1101 in an n-type well 1103 and an n-channel FET 1102 in a p-type well 1104.

The FETs for example correspond to the FETs of FIG. 2.

An n-type well contact 1105 is connected to the gate of the p-channel FET 1101 and a p-type well contact 1106 is connected to the gate of the n-channel FET 1102.

If the potential in the n-type well 1103 falls below the provided n-type well potential (VDDBULK) by approximately a p-channel FET threshold voltage, then the p-channel FET 1101 connects the p-type well contact 1106 (and thus the p-type well 1104) to VDD.

Conversely, if the potential in the p-type well 1104 rises above the provided p-type well potential (VSSBULK) by approximately an n-channel FET threshold voltage on account of a radiation attack, then the n-channel FET 1102 connects the n-type well contact 1105 (and thus the n-type well 1103) to VSS.

The circuit 1100 thus realizes a feedback between the wells 1103, 1104 and a sufficient change in the potential in one of the two wells on account of a radiation attack also brings about a change in the other well and thus amplifies the effect of the radiation attack on the substrate.

In other words, a "short-circuit" between the local well potentials VDDBULK with VSS or VSSBULK with VDD, respectively, is caused by a radiation attack on one of the wells. This mechanism can be used (by including one or more, possibly a large number of circuits 1100 in the chip 101: the relaxation of a D-CTC arranged in the same well regions as a circuit 1100 can be significantly increased due to the "short-circuit" mechanism of the circuit 1100 in case of a laser attack while a P-CTC associated with the D-CTC as illustrated in FIG. 7 may be further away (e.g. formed at least partially in a different well or generally a different region of the semiconductor chip) and may thus not be influenced by the laser attack. Thus, the number of D-CTC elements on the chip 101 required to reliably detect fault attacks may be reduced.

Figure 12:
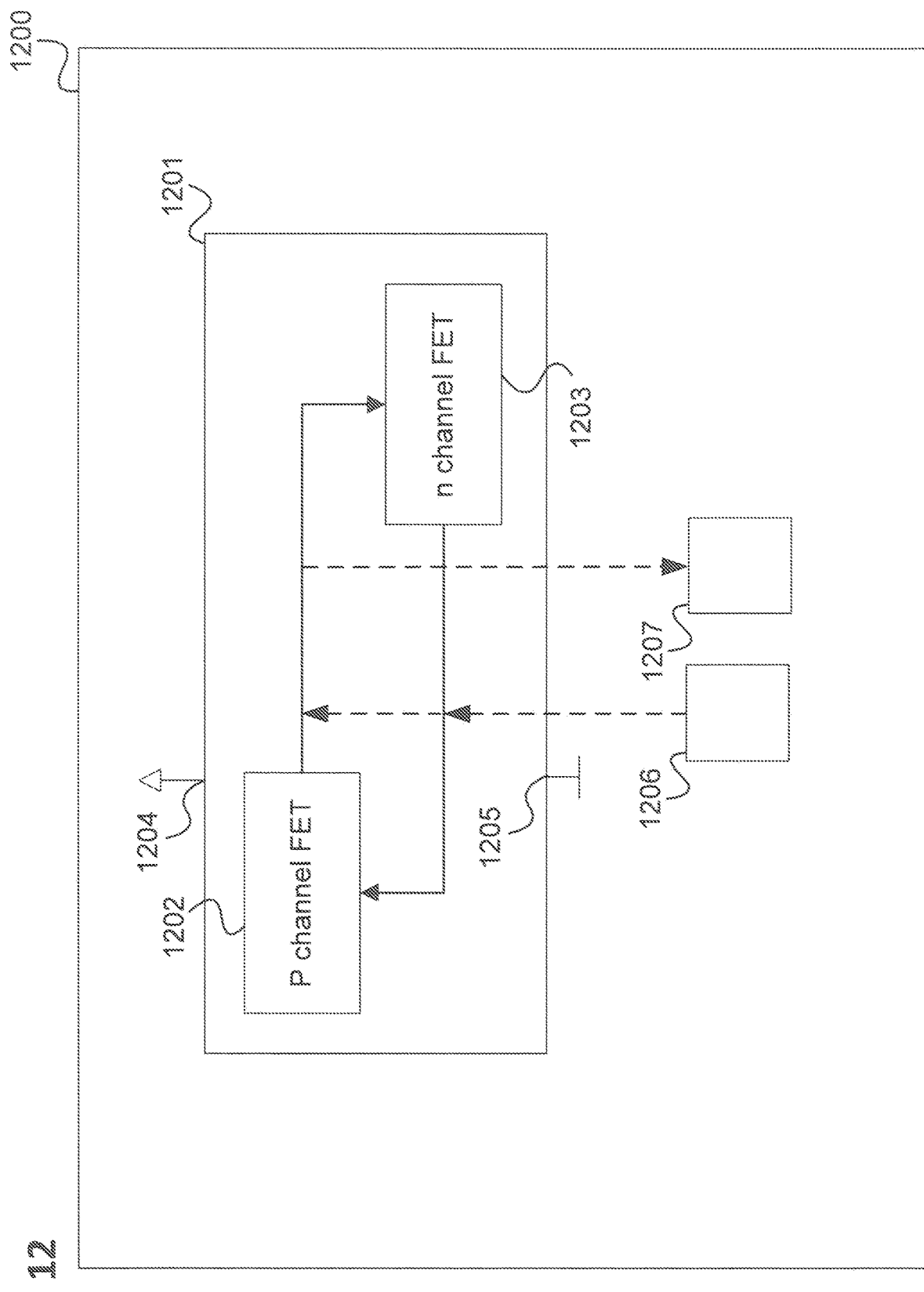
FIG. 12 shows a semiconductor chip according to an embodiment.

In summary, according to various embodiments a semiconductor chip is provided as illustrated in FIG. 12.

FIG. 12 shows a semiconductor chip 1200 according to an embodiment.

The semiconductor chip includes a circuit 1201 which includes at least one p-channel field effect transistor 1202, at least one n-channel field effect transistor 1203, a first power supply terminal 1204 configured to receive a first supply voltage with an upper supply potential and a second power supply terminal 1205 configured to receive a second supply voltage with a lower supply potential.

The at least one p-channel field effect transistor 1202 and the at least one n-channel field effect transistor 1203 are connected such that the at least one n-channel field effect transistor 1203, if supplied with the upper supply potential at its gate, supplies the lower supply potential to the gate of the at least one p-channel field effect transistor 1202 and the at least one p-channel field effect transistor 1202, if supplied with the lower supply potential at its gate, supplies the upper supply potential to the gate of the at least one n-channel field effect transistor 1203.

The semiconductor chip 1200 further includes a precharge circuit 1206 configured to precharge the circuit 1201 to a first state in which the potential at the gate of the at least one n-channel field effect transistor 1203 is lower than the upper supply potential 1204 and the potential at the gate of the at least one p-channel field effect transistor 1202 is higher than the lower supply potential 1205.

Further, the semiconductor chip 1200 includes a detection circuit 1207 configured to detect whether the circuit 1201 has entered a second state in which the potential at the gate of the at least one n-channel field effect transistor 1203 is the upper supply potential and the potential at the gate of the at least one p-channel field effect transistor 1202 is the lower supply potential and configured to output an alarm signal if it has detected that the circuit 1201 has entered the second state.

According to various embodiments, in other words, a TIE cell with at least one p-channel FET and at least n-channel FET which hold each other in a steady state by turning each other on, is precharged to an inverse state. The inverse state is inverse to the steady state in the sense that the FETs are turned off. An alarm is output if ever the TIE cell reaches its steady state since this is typically an indication of a radiation attack.

The first state may be a state when the FETs are turned off and the second state may be a state when the FETs are turned on. It should be noted that there may be a "relaxation state" between the first state and the second state i.e. a state which the circuit has when transitioning from the first state to the second state. The first state (possibly together with the relaxation state) may be seen as "non-equilibrium" state.

The relaxation state for example starts when the precharge circuit finishes precharging the circuit, i.e. releases the circuit from the first state (which is enforced by the precharge). For example, in the first state the precharge circuit forces the circuit to be (and stay in the first state) and then "releases" the circuit to transition into its second state. However, the FETs are dimensioned such that the circuit will not reach the second state (under normal operating conditions) when there is no radiation attack since the precharge circuit is configured to re-precharge the circuit to the first state before the relaxation time has elapsed, i.e. before the circuit has reached the second state.

Various Examples are described in the following:

Example 1 is a semiconductor chip as illustrated in FIG. 12.

Example 2 is a semiconductor chip according to Example 1, wherein the precharge circuit is configured to let the circuit start transitioning from the first state to the second state after precharging the circuit to the first state.

Example 3 is a semiconductor chip according to Example 1 or 2, wherein the precharge circuit is configured to periodically precharge the circuit to the first state.

Example 4 is a semiconductor chip according to Example 3, wherein the period of the precharging is shorter than a relaxation time of the circuit from the first state into the second state.

Example 5 is a semiconductor chip according to Example 4, wherein the relaxation time is a relaxation time of the circuit under non-radiation attack conditions.

Example 6 is a semiconductor chip according to any one of Examples 3 to 5, wherein the period of the precharging is longer than a relaxation time of the circuit from the first state into the second state under radiation attack conditions.

Example 7 is a semiconductor chip according to any one of Examples 1 to 6, wherein the second state is a steady state of the circuit and the first state is an inverse state of the second state.

Example 8 is a semiconductor chip according to any one of Examples 1 to 7, wherein in the first state the potential at the gate of the at least one n-channel field effect transistor is the lower supply potential and the potential at the gate of the at least one p-channel field effect transistor is the higher supply potential.

Example 9 is a semiconductor chip according to any one of Examples 1 to 8, wherein in the first state the potential at the gate of the at least one n-channel field effect transistor is a potential to turn off the n-channel field effect transistor and the potential at the gate of the at least one p-channel field effect transistor is a potential to turn off the p-channel field effect transistor.

Example 10 is a semiconductor chip according to any one of Examples 1 to 9, including a second circuit including at least one p-channel field effect transistor; at least one n-channel field effect transistor; a first power supply terminal configured to receive the first supply voltage with the upper supply potential; a second power supply terminal configured to receive the second supply voltage with the lower supply potential; wherein the at least one p-channel field effect transistor and the at least one n-channel field effect transistor are connected such that the at least one n-channel field effect transistor, if supplied with the upper supply potential at its gate, supplies the lower supply potential to the gate of the at least one p-channel field effect transistor; and the at least one p-channel field effect transistor, if supplied with the lower supply potential at its gate, supplies the upper supply potential to the gate of the at least one n-channel field effect transistor; and a second precharge circuit configured to precharge the second circuit to a first state in which the potential at the gate of the at least one n-channel field effect transistor is lower than the upper supply potential and the potential at the gate of the at least one p-channel field effect transistor is higher than the lower supply potential, wherein the gate of the at least one p-channel field effect transistor or the gate of the at least one n-channel field effect transistor is coupled to the precharge circuit of the circuit such that the state of the second circuit controls the precharge of the circuit.

Example 11 is a semiconductor chip according to Example 10, wherein the gate of the at least one p-channel field effect transistor of the second circuit or the gate of the at least one n-channel field effect transistor of the second circuit is coupled to the precharge circuit of the circuit such that that precharge circuit precharges the circuit when the second circuit is in its first state.

Example 12 is a semiconductor chip according to Example 10 or 11, wherein the circuit and the second circuit are located at least partially in different wells of the semiconductor chip.

Example 13 is a semiconductor chip according to any one of Examples 10 to 12, including a plurality of circuits and precharge circuits, wherein the state of the second circuit controls the precharge of the plurality of circuits.

Example 14 is a semiconductor chip according to any one of Examples 10 to 13, including a plurality of second circuits and a combination circuit configured to control the precharge of the circuit based on a combination of the states of the second circuits.

Example 15 is a semiconductor chip according to any one of Examples 10 to 14, wherein the relaxation time from the first state to the second state of the second circuit is, under same ambient conditions, shorter than the relaxation time from the first state to the second state of the first circuit.

Example 16 is a semiconductor chip according to any one of Examples 1 to 15, wherein the circuit includes: a plurality of p-channel field effect transistors; wherein the p-channel field effect transistors and the at least one n-channel field effect transistor are connected such that the at least one n-channel field effect transistor, if supplied with a upper supply potential at its gate, supplies the lower supply potential to the gates of the p-channel field effect transistors; and the p-channel field effect transistors, if supplied with the lower supply potential at their gates, supply the upper supply potential to the gate of the at last one n-channel field effect transistor.

Example 17 is a semiconductor chip according to any one of Examples 1 to 15, wherein the circuit includes: a plurality of n-channel field effect transistors; wherein the n-channel field effect transistors and the at least one p-channel field effect transistor are connected such that the at least one p-channel field effect transistor, if supplied with a lower supply potential at its gate, supplies the higher supply potential to the gates of the n-channel field effect transistors; and the n-channel field effect transistors, if supplied with the higher supply potential at their gates, supply the lower supply potential to the gate of the at last one p-channel field effect transistor.

Example 18 is a semiconductor chip according to any one of Examples 1 to 15, wherein the circuit includes: a plurality of p-channel field effect transistors; a plurality of n-channel field effect transistors; wherein the p-channel field effect transistors and the n-channel field effect transistors are connected such that the n-channel field effect transistors, if supplied with a upper supply potential at their gates, supply the lower supply potential to the gates of the p-channel field effect transistors; and the p-channel field effect transistors, if supplied with the lower supply potential at their gates, supply the upper supply potential to the gates of the n-channel field effect transistors.

Example 19 is a semiconductor chip according to Example 18, wherein the p-channel field effect transistors are connected in series and their gates are connected and the n-channel field effect transistors are connected in series and their gates are connected.

Example 20 is a semiconductor chip according to any one of Examples 1 to 19, including a plurality of circuits, each circuit including at least one p-channel field effect transistor; at least one n-channel field effect transistor; a first power supply terminal configured to receive a first supply voltage with an upper supply potential; and a second power supply terminal configured to receive a second supply voltage with a lower supply potential; wherein the at least one p-channel field effect transistor and the at least one n-channel field effect transistor are connected such that the at least one n-channel field effect transistor, if supplied with the upper supply potential at its gate, supplies the lower supply potential to the gate of the at least one p-channel field effect transistor; and the at least one p-channel field effect transistor, if supplied with the lower supply potential at its gate, supplies the upper supply potential to the gate of the at least one n-channel field effect transistor; a precharge circuit for each circuit of the plurality of circuits configured to precharge the circuit to a first state in which the potential at the gate of the at least one n-channel field effect transistor is lower than the upper supply potential and the potential at the gate of the at least one p-channel field effect transistor is higher than the lower supply potential; a detection circuit configured to detect whether any one of the plurality of circuits has entered a second state in which the potential at the gate of the at least one n-channel field effect transistor is the upper supply potential and the potential at the gate of the at least one p-channel field effect transistor is the lower supply potential and configured to output an alarm signal if it has detected that any one of the plurality of circuits has entered the second state.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE SIGNS

100 Data processing device
101 Chip
102 Attack protection circuitry
201 Photocurrent pulses
202 pn junction
203, 204 Wells
205, 206 MOSFETs
207, 208 Bipolar transistors
300 TIE cell
301, 302 FETs
400 Controlled TIE cell 401, 402 FETs
403 Inverter
404, 405 FETs
406 Inverter
501-503 States
504 Rising edge
601 Photocurrent pulses
602 pn junction
603, 604 Wells
605, 606 MOSFETs
607, 608 Bipolar transistors
700 Fault detection arrangement
701 P-CTC
702 CTC
703 Feedback circuitry
704 D-CTCs
705 Alarm handling circuit
800 Controlled TIE cell
801-804 FETs
805 Inverter
806, 807 FETs
808 Inverter
900 Controlled TIE cell
901, 902 FETs
903 Inverter
904-909 FETs
910 Inverter
1000 CTC arrangement
1001 P-CTCs
1002 D-CTCs
1003 Control circuit
1100 Circuitry for fault attack detection
1101, 1102 FETs
1103, 1104 Wells
1105, 1106 Well contacts
1200 Semiconductor chip
1201 Circuit
1202, 1203 FETs
1204, 1205 Supply terminals
1206 Precharge circuit
1207 Detection circuit

What is claimed is:

1. A semiconductor chip comprising:
 a first circuit comprising:
  at least one first-circuit p-channel field effect transistor;
  at least one first-circuit n-channel field effect transistor;
  a first power supply terminal configured to receive a first supply voltage with an upper supply potential; and
  a second power supply terminal configured to receive a second supply voltage with a lower supply potential;
  wherein the at least one first-circuit p-channel field effect transistor and the at least one first-circuit n-channel field effect transistor are connected such that
   the at least one first-circuit n-channel field effect transistor, if supplied with the upper supply potential at its gate, supplies the lower supply potential to the gate of the at least one first-circuit p-channel field effect transistor; and
   the at least one first-circuit p-channel field effect transistor, if supplied with the lower supply potential at its gate, supplies the upper supply potential to the gate of the at least one first-circuit n-channel field effect transistor;
 a precharge circuit, comprising:
  a second circuit, comprising:
   at least one second-circuit p-channel field effect transistor;
   at least one second-circuit n-channel field effect transistor;
   a third power supply terminal configured to receive a third supply voltage with an upper supply potential; and
   a fourth power supply terminal configured to receive a fourth supply voltage with a lower supply potential;
   wherein the at least one second-circuit p-channel field effect transistor and the at least one second-circuit n-channel field effect transistor are connected such that the at least one second-circuit n-channel field effect transistor, if supplied with the upper supply potential at its gate, supplies the lower supply potential to the gate of the at least one second-circuit p-channel field effect transistor; and
   the at least one second-circuit p-channel field effect transistor, if supplied with the lower supply potential at its gate, supplies the upper supply potential to the gate of the at least one second-circuit n-channel field effect transistor; and
  a feedback circuit, comprising:
   an input that is electrically conductively connected to an output of the second circuit; and
   an output that is electrically conductively connected to an input of the second circuit;
   wherein the feedback circuit is configured to output a pre-charging signal to the input of the second circuit based on the output of the second circuit;
  wherein the precharge circuit is configured to precharge the first circuit to a first state in which the potential at the gate of the at least one first-circuit n-channel field effect transistor is lower than the upper supply potential and the potential at the gate of the at least one first-circuit p-channel field effect transistor is higher than the lower supply potential; and
 a detection circuit configured to detect whether the first circuit has entered a second state in which the potential at the gate of the at least one first-circuit n-channel field effect transistor is the upper supply potential and the potential at the gate of the at least one first-circuit p-channel field effect transistor is the lower supply potential and configured to output an alarm signal if it has detected that the first circuit has entered the second state.

2. The semiconductor chip of claim 1, wherein the precharge circuit is configured to let the first circuit start transitioning from the first state to the second state after precharging the circuit to the first state.

3. The semiconductor chip of claim 1, wherein the precharge circuit is configured to periodically precharge the second circuit to the first state.

4. The semiconductor chip of claim 3, wherein the period of the precharging of the second circuit is shorter than a relaxation time of the first circuit from the first state into the second state.

5. The semiconductor chip of claim 4, wherein the relaxation time is a relaxation time of the first circuit under non-radiation attack conditions.

6. The semiconductor chip of claim 3, wherein the period of the precharging of the second circuit is longer than a relaxation time of the first circuit from the first state into the second state under radiation attack conditions.

7. The semiconductor chip of claim 1, wherein the second state is a steady state of the first circuit and the first state is an inverse state of the second state.

8. The semiconductor chip of claim 1, wherein in the first state the potential at the gate of the at least one first-circuit n-channel field effect transistor is the lower supply potential and the potential at the gate of the at least one first-circuit p-channel field effect transistor is the higher supply potential.

9. The semiconductor chip of claim 1, wherein in the first state the potential at the gate of the at least one first-circuit n-channel field effect transistor is a potential to turn off the n-channel field effect transistor of the first circuit and the potential at the gate of the at least one first-circuit p-channel field effect transistor is a potential to turn off the p-channel field effect transistor of the first circuit.

10. The semiconductor chip of claim 1, wherein the first circuit and the second circuit are located at least partially in different wells of the semiconductor chip.

11. The semiconductor chip of claim 1, comprising a plurality of circuits and precharge circuits, wherein the state of the second circuit controls the precharge of the plurality of circuits.

12. The semiconductor chip of claim 1, wherein the relaxation time from the first state to the second state of the second circuit is, under same ambient conditions, shorter than the relaxation time from the first state to the second state of the first circuit.

13. The semiconductor chip of claim 1, wherein the first circuit comprises:
a plurality of first-circuit p-channel field effect transistors;
wherein the first-circuit p-channel field effect transistors and the at least one first-circuit n-channel field effect transistor are connected such that
the at least one first-circuit n-channel field effect transistor, if supplied with a upper supply potential at its gate, supplies the lower supply potential to the gates of the first-circuit p-channel field effect transistors; and
the first-circuit p-channel field effect transistors, if supplied with the lower supply potential at their gates, supply the upper supply potential to the gate of the at least one first-circuit n-channel field effect transistor.

14. The semiconductor chip of claim 1, wherein the first circuit comprises:
a plurality of first-circuit n-channel field effect transistors;
wherein the first-circuit n-channel field effect transistors and the at least one first-circuit p-channel field effect transistor are connected such that
the at least one first-circuit p-channel field effect transistor, if supplied with a lower supply potential at its gate, supplies the higher supply potential to the gates of the first-circuit n-channel field effect transistors; and
the first-circuit n-channel field effect transistors, if supplied with the higher supply potential at their gates, supply the lower supply potential to the gate of the at last one first-circuit p-channel field effect transistor.

15. The semiconductor chip of claim 1, wherein the first circuit comprises:
a plurality of first-circuit p-channel field effect transistors;
a plurality of first-circuit n-channel field effect transistors;
wherein the first-circuit p-channel field effect transistors and the first-circuit n-channel field effect transistors are connected such that
the first-circuit n-channel field effect transistors, if supplied with a upper supply potential at their gates, supply the lower supply potential to the gates of the first-circuit p-channel field effect transistors; and
the first-circuit p-channel field effect transistors, if supplied with the lower supply potential at their gates, supply the upper supply potential to the gates of the first-circuit n-channel field effect transistors.

16. The semiconductor chip of claim 15, wherein the first-circuit p-channel field effect transistors are connected in series and their gates are connected and the first-circuit n-channel field effect transistors are connected in series and their gates are connected.

17. The semiconductor chip of claim 1, comprising a plurality of circuits,
each circuit comprising
at least one first-circuit p-channel field effect transistor;
at least one first-circuit n-channel field effect transistor;
a first power supply terminal configured to receive a first supply voltage with an upper supply potential; and
a second power supply terminal configured to receive a second supply voltage with a lower supply potential;
wherein the at least one first-circuit p-channel field effect transistor and the at least one first-circuit n-channel field effect transistor are connected such that
the at least one first-circuit n-channel field effect transistor, if supplied with the upper supply potential at its gate, supplies the lower supply potential to the gate of the at least one first-circuit p-channel field effect transistor; and
the at least one first-circuit p-channel field effect transistor, if supplied with the lower supply potential at its gate, supplies the upper supply potential to the gate of the at least one first-circuit n-channel field effect transistor;
a precharge circuit for each circuit of the plurality of circuits configured to precharge the circuit to a first state in which the potential at the gate of the at least one first-circuit n-channel field effect transistor is lower than the upper supply potential and the potential at the gate of the at least one first-circuit p-channel field effect transistor is higher than the lower supply potential;
a detection circuit configured to detect whether any one of the plurality of circuits has entered a second state in which the potential at the gate of the at least one first-circuit n-channel field effect transistor is the upper supply potential and the potential at the gate of the at least one first-circuit p-channel field effect transistor is the lower supply potential and configured to output an alarm signal if it has detected that any one of the plurality of circuits has entered the second state.

18. The semiconductor chip of claim 1, wherein the feedback circuit comprising the output that is electrically conductively connected to the input of the second circuit comprises the output of the feedback circuit being electrically conductively connected to a gate of the second-circuit p-channel field effect transistor.

19. The semiconductor chip of claim 18, wherein the feedback circuit comprising the input that is electrically conductively connected to the output of the second circuit comprises the input of the feedback circuit being electrically conductively connected to a train of the second-circuit p-channel field effect transistor.

* * * * *